United States Patent
Kitamura et al.

(10) Patent No.: US 7,199,420 B2
(45) Date of Patent: Apr. 3, 2007

(54) SEMICONDUCTOR DEVICE

(75) Inventors: Takuya Kitamura, Kawasaki (JP);
Takashi Sakoh, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 79 days.

(21) Appl. No.: 11/140,181

(22) Filed: May 31, 2005

(65) Prior Publication Data

US 2005/0265100 A1 Dec. 1, 2005

(30) Foreign Application Priority Data

May 31, 2004 (JP) ............................. 2004-162337

(51) Int. Cl.
*H01L 29/72* (2006.01)
(52) U.S. Cl. ...................... 257/306; 257/296; 257/379; 257/382; 257/401; 257/532; 257/618; 257/632
(58) Field of Classification Search ................ 257/296, 257/306, 379, 382, 401, 532, 618, 632
See application file for complete search history.

(56) References Cited

U.S. PATENT DOCUMENTS 6,537,874 B2 * 3/2003 Nakamura et al. .......... 438/253

FOREIGN PATENT DOCUMENTS

| JP | 2001-068636 | 3/2001 |
| JP | 2003-100910 | 4/2003 |

* cited by examiner

*Primary Examiner*—Edward Wojciechowicz
(74) *Attorney, Agent, or Firm*—Young & Thompson

(57) ABSTRACT

A memory region including a capacitor element, a logic region including a logic circuit, and a boundary region located between the memory region and the logic region are provided on a silicon substrate. The memory region includes a plurality of memory transistors and memory transistor connection plugs. The boundary region includes a dummy contact plug in the same layer as the memory transistor connection plugs and logic transistor connection plugs. The upper face of the dummy contact plug is covered with a second insulating layer. An end portion of a capacitor layer and an upper electrode is located closer to an inner region of the memory region than the dummy contact plug is.

6 Claims, 10 Drawing Sheets

FIG. 7 MEMORY TRANSISTOR CONNECTION PLUG 117 CONNECTED TO A BIT LINE SHARED BY TWO MEMORY CELLS

MEMORY TRANSISTOR CONNECTION PLUG 117 LOCATED AT AN OUTERMOST PERIPHERY OF MEMORY SECTION 102

MEMORY TRANSISTOR CONNECTION PLUG 117 CONNECTED TO A BIT LINE SHARED BY TWO MEMORY CELLS

MEMORY TRANSISTOR CONNECTION PLUG 117 LOCATED AT AN OUTERMOST PERIPHERY OF MEMORY SECTION 102

EDGE OF CAPACITANCE ELEMENT 130

SEMICONDUCTOR DEVICE

This application is based on Japanese patent application No. 2004-162337, the content of which is incorporated hereinto by reference.

BACKGROUND OF THE INVENTION

1. Field of the Invention

The present invention relates to a semiconductor device including a memory region and a logic region embedded on a semiconductor substrate.

2. Description of the Related Art

With a semiconductor device including a memory element, a pattern collapse that happens when forming a repetition pattern of a memory cell has been one of serious issues to be overcome.

Accordingly, JP-A No. 2001-68636 proposes a technique to prevent the pattern collapse. This document discloses a technique of disposing one or more dummy cells of a same shape as a memory cell, but without a memory function, at an end of a memory cell array of a semiconductor device so as to restrain a pattern collapse of the working memory cell, to thereby reducing a yield loss.

Also, JP-A No. 2003-100910 discloses a technique of providing a dummy cell plug in a semiconductor device including a memory region constituted of DRAM memory cells and a logic region, though this is intended for a different purpose. In the structure disclosed therein, the memory region includes an effective memory cell region and a dummy cell region provided around a periphery of the effective memory cell region. The dummy cell region is provided with an upper electrode extension led from the upper electrode of the DRAM memory cell, and the dummy cell plug is located below the upper electrode extension.

SUMMARY OF THE INVENTION

However, the present inventors have now recognized, upon studying the semiconductor device on which a memory region including a repetition pattern of memory cells and a logic region are embedded, that a pattern collapse unique to such an embedded device, and different from that of the memory cells, is incurred, even when the foregoing technique of providing a dummy cell is employed.

In addition, the present inventors have made up an embedded device on which an upper electrode of a cylindrical capacitor element is extended over a dummy cell plug, based on the patented document 2. As a result, it has been discovered that such a semiconductor device also incurs a pattern collapse unique to an embedded device. Such a pattern collapse will be described referring to FIG. 12.

FIG. 12 is a schematic cross-sectional view showing a structure of a popular embedded device. Referring to FIG. 12, a semiconductor device 200 includes a memory region 202 and a logic region 204 combined on a chip formation surface of a silicon substrate 201, and a boundary region 206 located between the memory region 202 and the logic region 204.

In the semiconductor device 200, a first insulating layer 215, a second insulating layer 229 and a third insulating layer 237 are layered in this sequence on the silicon substrate 201.

In the memory region 202 on the silicon substrate 201, a plurality of transistors 211 for memory is provided. The memory transistors 211 include a diffusion layer 205, a gate oxide film 207 and a gate electrode 209, and an isolation region 203 buried in the silicon substrate 201 is provided along an outer periphery of the diffusion layer 205.

The memory transistor 211 is covered with the first insulating layer 215. The first insulating layer 215 includes a plurality of memory transistor connection plugs 217. The memory transistor connection plugs 217 are connected to the diffusion layer 205 in the memory transistor 211.

The second insulating layer 229 includes a through hole that communicates with memory transistor connection plug 217. The side wall of the through hole and the upper face of the memory transistor connection plug 217 are covered with a lower electrode 231. The bottom face of the lower electrode 231 is in contact with the memory transistor connection plug 217. A capacitor layer 233 is provided in contact with an upper surface of the lower electrode 231. In addition, an upper electrode 235 is provided in contact with an upper surface of the capacitor layer 233, so as to fill the through hole.

A capacitor element 230 includes the lower electrode 231, the capacitor layer 233 and the upper electrode 235. The upper electrode 235 is shared by a plurality of the capacitor elements 230. The upper surface of the upper electrode 235 is covered with the third insulating layer 237.

In the boundary region 206, the first insulating layer 215 includes a dummy contact plug 208 which is of the same shape as the memory transistor connection plug 217. According to FIG. 12, some of the memory transistors 211 are projecting into the boundary region 206, and the dummy contact plug 208 is connected to the diffusion layer of the memory transistor 211.

The dummy contact plug 208 is an isolated plug that is not connected to the capacitor element 230 and a bit line (not shown). The capacitor layer 233 and the upper electrode 235 are provided over the memory region 202 and a region in the boundary region 206 above the dummy contact plug 208.

In the logic region 204, a plurality of logic transistors 213 is provided on the silicon substrate 201. The logic transistors 213 include the diffusion layer 205, the gate oxide film 207 and the gate electrode 209, and the isolation region 203 buried in the silicon substrate 201 is provided along an outer periphery of the diffusion layer 205.

The logic transistors 213 are covered with the first insulating layer 215. The first insulating layer 215 includes a plurality of logic transistor connection plugs 219. The logic transistor connection plugs 219 are connected to the diffusion layer 205 in the logic transistor 213, and terminated at an upper surface of the first insulating layer 215, as the memory transistor connection plug 217.

Through the second insulating layer 229 and the third insulating layer 237, a plurality of interconnection plugs 239 is provided. The interconnection plugs 239 are terminated on an upper surface of the third insulating layer 237, for connection to a interconnect layer (not shown) to be formed on the third insulating layer 237.

As a result of the studies by the present inventors on the semiconductor device 200 thus constructed, it has been confirmed that providing the dummy contact plug 208 is effective in forming without incurring a pattern collapse the memory transistor connection plug 217 at an outermost position in the memory region 202, that is, adjacent to the dummy contact plug 208. On the other hand, it has been discovered that another pattern collapse of the interconnection plug 239 is incurred during the formation thereof, in a region close to the boundary region 206 in the logic region 204.

Such faulty formation of the logic circuit near the boundary region 206 decreases the formation area of an effective logic circuit, which is undesirable from the viewpoint of micronization of the semiconductor device 200. The conventional technique is not effective with this type of pattern collapse, and hence a different measure has to be taken.

The present inventors have analyzed the factors associated with the pattern collapse incurred in a region close to the boundary region 206 in the logic region 204 of the embedded semiconductor device 200 (FIG. 12). It has proved that a height gap corresponding to a film thickness of the upper electrode 235 and the capacitor layer 233 is created in the third insulating layer 237, which makes an upper surface of the third insulating layer 237 on the side of the memory region 202 as much higher. A gap portion 210 is formed over an area including the boundary region 206 and a region close to the boundary region 206 in the logic region 204. This height gap (hereinafter, a global gap) is not leveled by a planarizing process such as CMP performed after the deposition of the third insulating layer 237, and therefore provokes a pattern collapse when forming a circuit in the boundary region 206. Referring to the semiconductor device 200 shown in FIG. 12, it has been concluded that it is because the capacitor element 230 or a constituent thereof is extending from the memory region 202 over a region including a portion of the boundary region 206 so as to reach a region above the dummy contact plug 208, that the gap portion 210 is created in a region close to the boundary region 206 in the logic region 204.

Accordingly, having sought to stably form both of the memory transistor connection plug 217 and the logic circuit, the present inventors have established a technique of locating the capacitor element 230 or a constituent thereof in the memory region 202, and disposing the dummy contact plug 208 in the boundary region 206 outside the memory transistor connection plug 217 while successfully suppressing a pattern collapse, thus achieving the present invention.

According to the present invention, there is provided a semiconductor device comprising a semiconductor substrate; a memory region provided on the semiconductor substrate, the memory region including a first transistor provided on a main surface of the semiconductor substrate, a first insulating layer covering the first transistor, a capacitor element formed on the first insulating layer, and a plurality of capacitor contact plugs connecting a diffusion layer of the first transistor and the capacitor element; a logic region provided on the semiconductor substrate, the logic region includes a second transistor provided on the semiconductor substrate and covered with the first insulating layer, an interconnect layer formed on the first insulating layer; and a boundary region located between the memory region and the logic region, provided on the semiconductor substrate, the boundary region including a dummy contact plug having its upper surface covered with an insulating layer and located in the same layer as the capacitor contact plug; wherein a conductive layer and a capacitor layer constituting the capacitor element are terminated at a position closer to an inner region of the memory region than the dummy contact plug is.

In the semiconductor device thus constructed, the dummy contact plug having its upper surface covered with the insulating layer is provided in the boundary region located between the memory region and the logic region, without being connected to the capacitor element or to any other conductive material. Therefore, the outermost capacitor contact plug that is located closest to the boundary region, among the plurality of capacitor contact plugs provided in the memory region, is prevented from incurring a pattern collapse.

Also, since an end portion of the conductive layer and the capacitor layer constituting the capacitor element is located closer to an inner region of the memory region than the dummy contact plug, emergence of a global gap in the logic region can be suppressed. Consequently, a pattern collapse in the logic region can be prevented. In an embedded device, since a region in a logic region close to a capacitor element is where micronized interconnect patterns are formed, presence of a gap often operates against precise formation of the circuit patterns. However, the configuration according to the present invention allows stably and precisely forming such a micronized circuit pattern.

It is to be noted that in the present invention the term "boundary region" designates a region between an edge of a capacitance and an edge of a second transistor. FIGS. 6 and 13 are plan views for explaining a configuration of a semiconductor device according to the present invention. In FIGS. 6 and 13, a memory region 102 and a logic region 104 are provided on a semiconductor substrate 165, between which a boundary region 106 is located. The memory region 102 includes a plurality of capacitor contact plugs 159, each of which is connected to a diffusion layer (not shown) of a first transistor, and on each of which a capacitor element 130 is provided. The logic region 104 includes a plurality of second transistors 157. The boundary region 106 includes dummy contact plugs 108.

Referring to FIGS. 6 and 13, the boundary region 106 represents a region between an edge portion 161 of the capacitor elements and an edge portion 163 of the second transistors. It is to be noted that the edge portion 161 of the capacitor element designates edge portions facing toward the logic region 104, of those capacitor elements 130 that are disposed closest to the logic region 104, among a plurality of the capacitor elements 130 included in the memory region 102. Likewise, the edge portion 163 of the second transistors designates edge portions facing toward the memory region 102, of those second transistors 157 disposed closest to the memory region 102, among the second transistors 157 included in the logic region 104.

In FIGS. 6 and 13, the conductive layer (not shown) constituting the capacitor element 130 may be provided so as to be shared by a plurality of capacitor elements 130.

It is also to be noted that the term "logic region" herein is used in a broad sense, including various circuit configurations, for example a region where a peripheral circuit of a memory region, such as a circuit for a sense amplifier or a circuit for an address selector, is provided.

The semiconductor device according to the present invention may further comprise a second insulating layer formed on the first insulating layer, and the capacitor element may include a first conductive member that covers an inner wall of a through hole located on top of the capacitor contact plug and penetrating the second insulating layer, and is connected to an upper face of the capacitor contact plug, a second conductive member located with a separation above the first conductive member so as to fill the through hole, and the capacitor layer located between the first conductive member and the second conductive member; and wherein an end portion of the second conductive member shared by a plurality of the capacitor elements may be located closer to an inner region of the memory region than a region where the dummy contact plug is provided. According to the present invention, an upper face of the dummy contact plug may be covered with the second insulating layer.

When cylindrical capacitor elements are provided in a memory region as above, in many cases, a second conductive member is provided for the capacitor elements in common and the second conductive member is extended farther outward from the region of the capacitor elements 130, for connection to an upper layer interconnect. Accordingly, the extended portion reaches a region close to a logic region. Thus in a conventional embedded device, the extended portion often creates a global gap, to thereby provoke a pattern collapse in the logic circuit.

On the contrary, according to the present invention, an end portion of the second conductive member is located closer to an inner region of the memory region than the region where the dummy contact plug is provided. Such configuration effectively suppresses a pattern collapse in the logic circuit, even in an embedded device in which cylindrical capacitor elements are provided in the memory region. Consequently, the design according to the present invention enables achieving a stabilized quality level, hence a higher yield through the production.

The semiconductor device according to the present invention may further comprise a row including a plurality of the capacitor contact plugs and the dummy contact plug, the capacitor contact plugs and the dummy contact plug may be linearly aligned with a spacing in the row, from the memory region toward the boundary region; and an end portion of the aligned row on the side of the boundary region is terminated at the dummy contact plug provided in the boundary region. Such configuration enhances the suppressing effect against a pattern collapse in those capacitance contacts disposed along an outer periphery close to the boundary region, among the capacitor contact plugs provided in the memory region.

In the semiconductor device according to the present invention, an end portion of the aligned row on the side of the boundary region is terminated at a plurality of the dummy contact plugs provided in the boundary region. Such configuration further ensures the suppressing effect against a pattern collapse in the logic circuit.

In the semiconductor device according to the present invention, the aligned row may include the capacitor contact plugs and the dummy contact plug disposed at regular intervals in the row. Such configuration further ensures the suppressing effect against a pattern collapse in the plurality of capacitance contacts provided in the memory region.

In the semiconductor device according to the present invention, the capacitor element may be a DRAM cell. Such configuration allows effectively suppressing a pattern collapse in the logic circuit, while also suppressing a pattern collapse in a conductive plug, in an semiconductor device including an embeddeed DRAM cell.

In the semiconductor device according to the present invention, a region in the boundary region, between an upper surface of the first insulating layer and an upper surface of the second insulating layer, may be constituted solely of the insulating layer. Such configuration effectively suppresses formation of a global gap in the logic region.

In the semiconductor device according to the present invention, the logic region may include a peripheral circuit of the memory region. Such configuration effectively suppresses a pattern collapse in the peripheral circuit around the memory region.

According to the present invention as above, there is provided a semiconductor device including a memory region, logic region, and a boundary region located between the memory region and the logic region, wherein the boundary region includes a dummy contact plug having its upper face covered with an insulating layer and formed in the same layer as the capacitor contact plug; and a conductive layer and a capacitor layer constituting the capacitor element are terminated at a position closer to an inner region of the memory region than the dummy contact plug is. The semiconductor device thus constructed allows stably forming a logic circuit pattern while effectively suppressing a pattern collapse in a capacitor element region.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE INVENTION

The present invention will be now described herein with reference to illustrative embodiments. Those skilled in the art will recognize that many alternative embodiments can be accomplished using the teachings of the present invention and that the invention is not limited to the embodiments illustrated for explanatory purposed.

Referring to the accompanying drawings, embodiments of the present invention will be described hereunder. Throughout all the drawings, same constituents are given an identical number, and detailed description thereof may be omitted when appropriate.

First Embodiment

Figure 1:
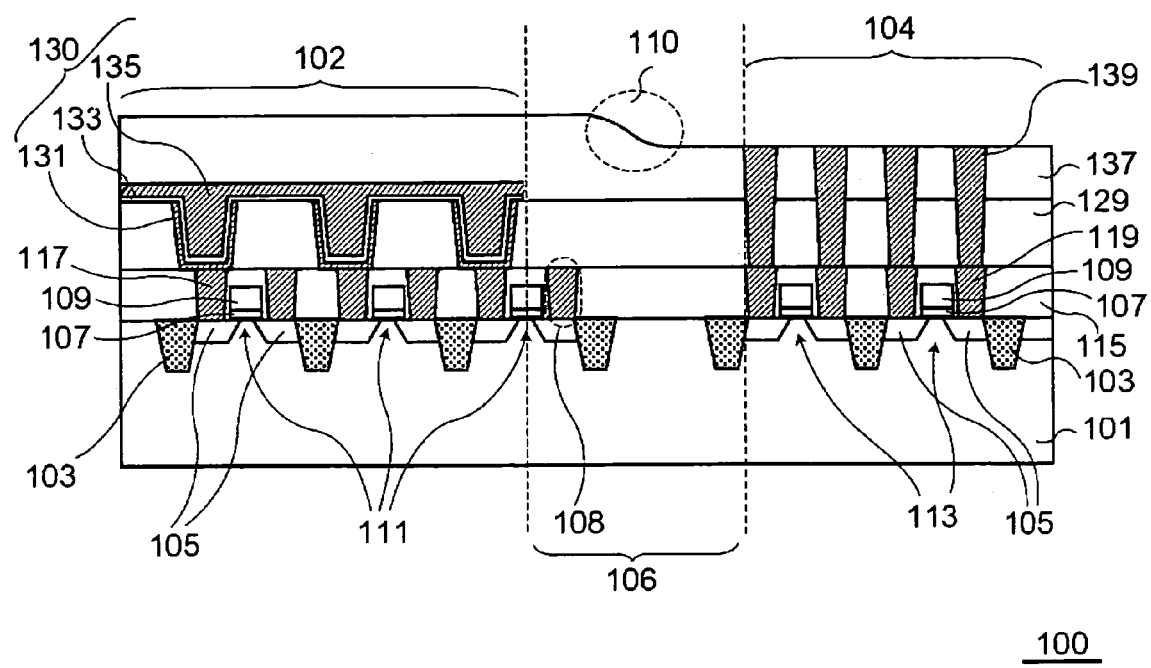
FIG. 1 is a schematic cross-sectional view showing a structure of a semiconductor device according to a first embodiment.

FIG. 1 is a schematic cross-sectional view showing a structure of a semiconductor device according to the first embodiment. Referring to FIG. 1, a semiconductor device 100 includes a silicon substrate 101, on which a memory region 102 including a capacitor element 130, a logic region 104 including a logic circuit, and a boundary region 106 located between the memory region 102 and the logic region 104 are provided. On a chip forming surface of the silicon substrate 101, a first insulating layer 115, a second insulating layer 129, and a third insulating layer 137 are layered in this sequence.

The memory region 102 includes a plurality (for example three as shown in FIG. 1) of memory transistors 111, provided on the chip forming surface of the silicon substrate 101. The memory transistor 111 includes a diffusion layer 105, a gate oxide film 107 and a gate electrode 109, and the diffusion layer 105 is surrounded by an isolation region 103 buried in the silicon substrate 101.

The memory transistor 111 is covered with a first insulating layer 115. The memory region 102 also includes the capacitor element 130 provided on the first insulating layer 115 and a plurality of conductive plugs connecting the diffusion layer 105 of the memory transistor 111 and the capacitor element 130.

Out of the two memory transistor connection plugs 117 connected to the diffusion layer 105 of one of the memory transistors 111, one is connected to the capacitor element 130 at an upper surface, while the other is connected to a bit line (not shown), directly or via another conductive plug. Accordingly, the region where the memory transistor connection plugs 117 are provided effectively serves as a memory cell region. Although the bit line of the memory region 102 is not shown in this and subsequent embodiments, the bit line may be disposed as desired in a predetermined layer in the memory region 102.

The capacitor element 130 includes a lower electrode 131, a capacitor layer 133 and an upper electrode 135. In the second insulating layer 129 provided on the first insulating layer 115, a through hole communicating with the memory transistor connection plug 117 is provided. The lower electrode 131 covers an inner wall of the through hole penetrating the second insulating layer 129, including a portion corresponding to the upper face of the memory transistor connection plug 117, thus to be connected to the upper face of the memory transistor connection plug 117. The upper electrode 135 is located above the lower electrode 131 with a separation therebetween, so as to fill the through hole. The capacitor layer 133 is provided between the lower electrode 131 and the upper electrode 135.

In the semiconductor device 100, the upper electrode 135 is shared by a plurality of capacitor elements 130. The upper electrode 135 is formed in one continuous body over the capacitor elements 130, with its end portion located closer to an inner region of the memory region 102, than a region where a dummy contact plug 108, to be later described, is provided. An upper surface of the upper electrode 135 is covered with the third insulating layer 137.

The boundary region 106 includes the dummy contact plug 108 having a same shape as the memory transistor connection plug 117 and a logic transistor connection plug 119 to be later described, and located in the same layer as these plugs. The dummy contact plug 108 is located at an outer position of the memory transistor connection plug 117 provided in the memory region 102, without being connected to any component such as the capacitor element 130 or the bit line (not shown), since an upper surface of the dummy contact plug 108 is covered with the second insulating layer 129.

An end portion of the capacitor layer 133 and the upper electrode 135 is located closer to an inner region of the memory region 102 than the region where the dummy contact plug 108 is provided. More specifically, according to FIG. 1, the capacitor layer 133 and the upper electrode 135 are terminated at an edge portion of the memory region 102. Accordingly, none of the constituents of the capacitor element 130 is proceeding into the boundary region 106, and hence the constituents of the capacitor element 130 are not extended to a region right above the dummy contact plug 108. Also, a region between the upper surface of the first insulating layer 115 and the upper the second insulating layer 129 is clear of an interconnect such as a bit line, and constituted solely of the insulating layer.

In the logic region 104, a plurality (for example two as shown in FIG. 1) of logic transistors 113 is provided on the silicon substrate 101. The logic transistor 113 includes a diffusion layer 105, a gate oxide film 107, and a gate electrode 109, and the diffusion layer 105 is surrounded by an isolation region 103 buried in the silicon substrate 101.

The logic transistor 113 is covered with the first insulating layer 115. The first insulating layer 115 includes a plurality of logic transistor connection plugs 119. The logic transistor connection plugs 119 are connected to the diffusion layer 105 in the logic transistor 113.

Through the second insulating layer 129 and the third insulating layer 137, a plurality of interconnection plugs 139 is provided. The interconnection plug 139 is terminated at an upper surface of the third insulating layer 137, thus to be connected to an interconnect layer (not shown) to be formed on the third insulating layer 137.

It is to be noted that, although this and the subsequent embodiments only refer to structures up to the third insulating layer 137 on the semiconductor device 100, a first interconnect layer including a first interconnect may be formed in the logic region on the third insulating layer 137, and further a multilayer interconnect structure may be formed on the first interconnect layer.

Figure 6:
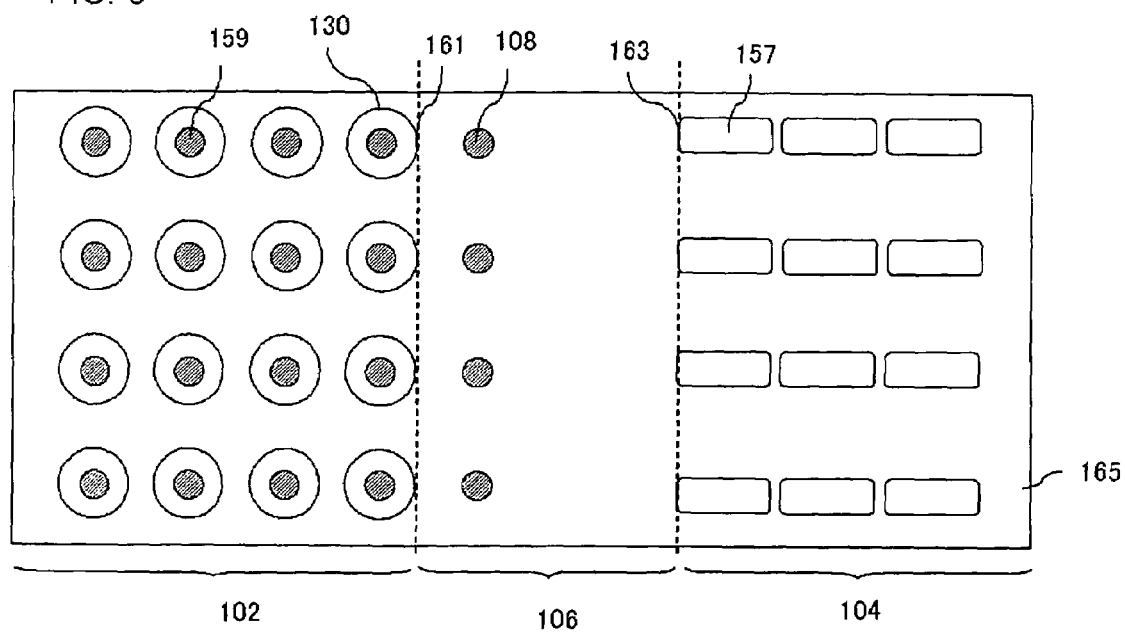
FIG. 6 is a schematic plan view showing a layout on a semiconductor device according to the present invention.
Figure 13:
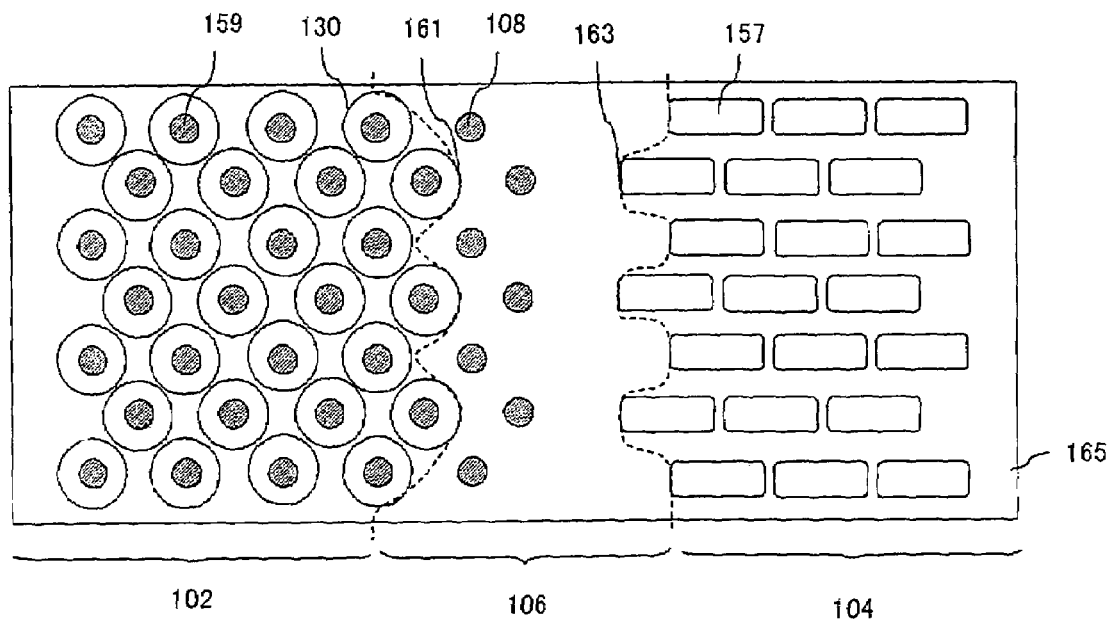
FIG. 13 is a schematic plan view showing another layout on a semiconductor device according to the present invention.

Also, according to this and the subsequent embodiments, the boundary region 106 designates a region between an edge facing toward the logic region 104, of those capacitor elements 130 disposed closest to the logic region 104, and an edge facing toward the memory region 102, of those logic transistors 113 disposed closest to the memory region 102, as already stated referring to FIGS. 6 and 13. The edge of the logic transistors 113 closest to the memory region 102 falls on a boundary portion between the diffusion layer 105 and the isolation region 103 closer to the memory region 102, associated with the logic transistor 113. In addition, the logic transistor 113 in FIG. 1 corresponds to the second transistor 157 in FIGS. 6 and 13.

Further, according to this and the subsequent embodiments, the edge facing the logic region 104, of the capacitor layer 133 and the upper electrode 135, is correspond in portion to the edge of the capacitor element 130.

Now, a method of manufacturing the semiconductor device 100 shown in FIG. 1 will be described. FIGS. 2A to 2C, 3A to 3C, 4A to 4C and 5 are schematic cross-sectional views sequentially showing a manufacturing process of the semiconductor device 100.

Figure 2A:
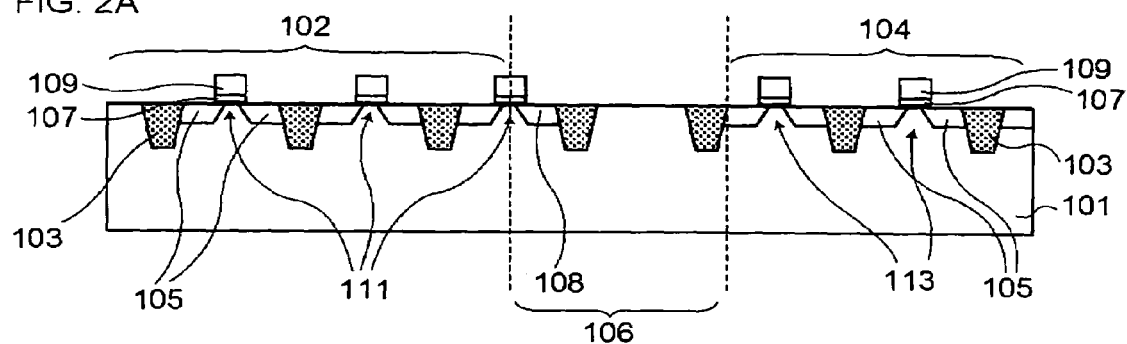
FIGS. 2A to 2C are schematic cross-sectional views sequentially showing a manufacturing process of the semiconductor device of FIG. 1.
Figure 2B:
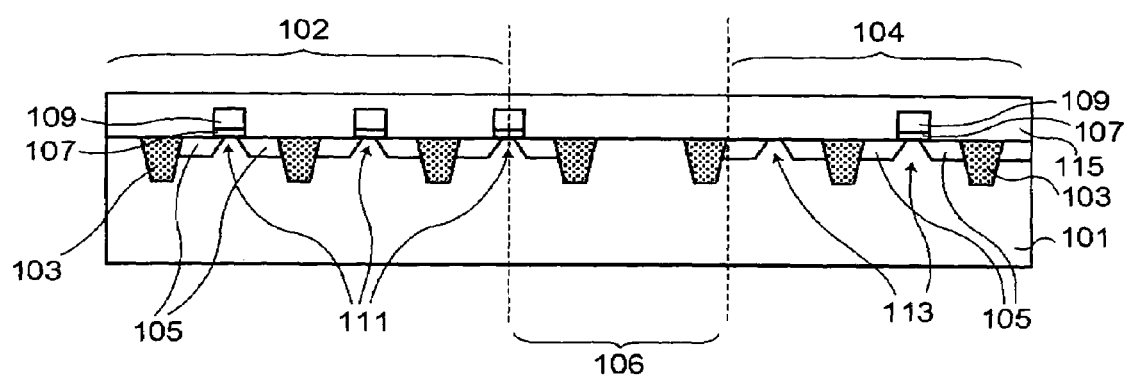

Referring first to FIG. 2A, an isolation region 103, a memory transistor 111 and a logic transistor 113 are formed on a silicon substrate 101. Then an etch-stopper layer (not shown) and a first insulating layer 115 are sequentially formed all over the silicon substrate 101, thus to cover the memory transistor 111 and the logic transistor 113 (FIG. 2B). As the etch-stopper layer, for example, an SiN film may be deposited by a plasma CVD process. As the first insulating layer 115, for instance, an $SiO_2$ film may be layered by a plasma CVD process. Alternatively, to constitute the first insulating layer 115, a low dielectric constant insulating interlayer may be first formed, for example by coating an L-Ox (trademark) film or depositing an SiOC film by plasma CVD, and then the $SiO_2$ film may be formed over the low dielectric constant insulating interlayer, thus to form a stacked layer.

Then a dry etching is performed on the first insulating layer 115 to selectively and simultaneously remove a region for memory transistor connection plugs 117 in the memory region 102, a region for a dummy contact plug 108 in the boundary region 106, and a region for logic transistor connection plugs 119 in the logic region 104. This is followed by another dry etching to etch back the etch-stopper layer (not shown) so as to expose the diffusion layer 105, thus forming connection holes.

Figure 2C:
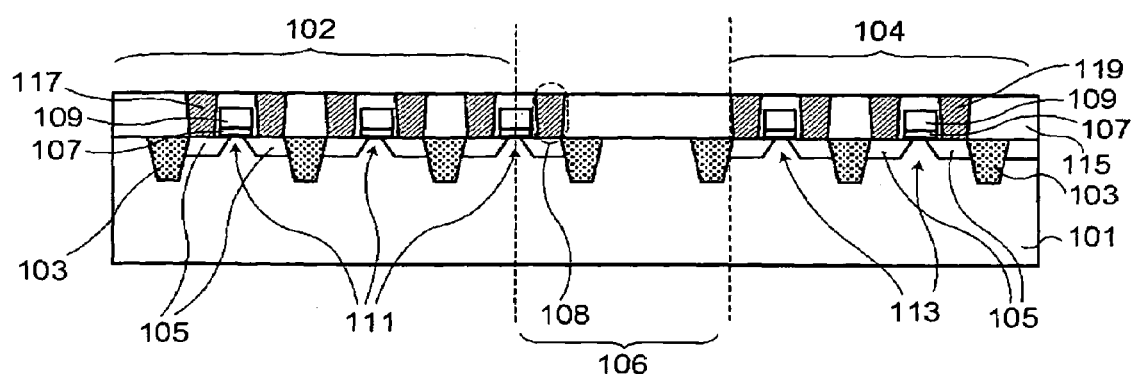

Thereafter a TiN layer (not shown) which is to serve as a barrier metal layer is deposited by a sputtering process, and a W (tungsten) film (not shown) is deposited on the barrier metal layer by a metal organic CVD process so as to fill the connection hole. A portion of the barrier metal layer and the W film laid on the first insulating layer 115 is then removed by a CMP (Chemical Mechanical Polishing) process, so that the memory transistor connection plugs 117, the dummy contact plug 108, and the logic transistor connection plugs 119 are formed (FIG. 2C).

Figure 3A:
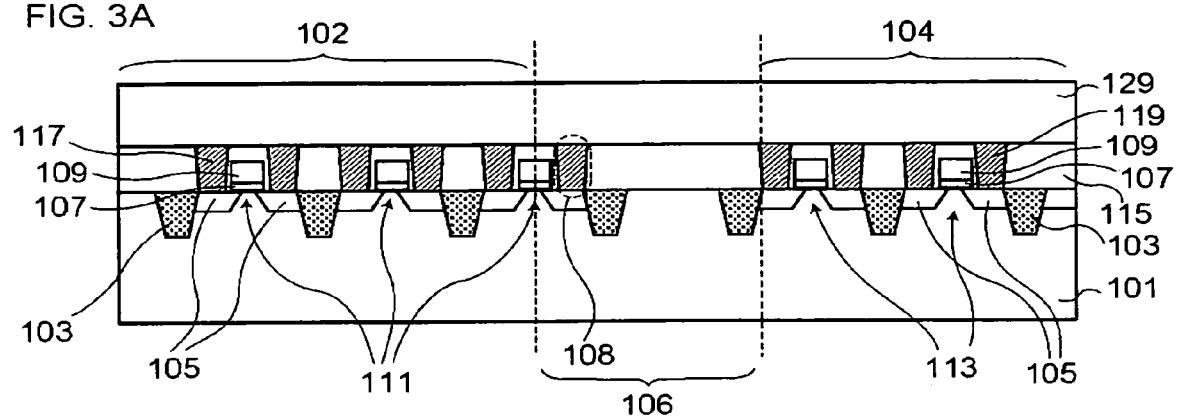
FIGS. 3A to 3C are schematic cross-sectional views sequentially showing a manufacturing process of the semiconductor device of FIG. 1.
Figure 3B:
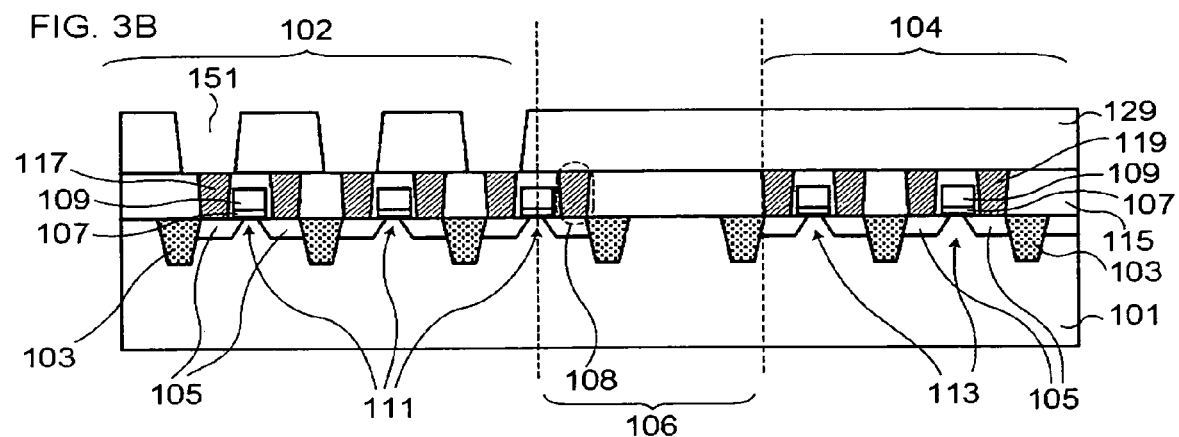
Figure 3C:
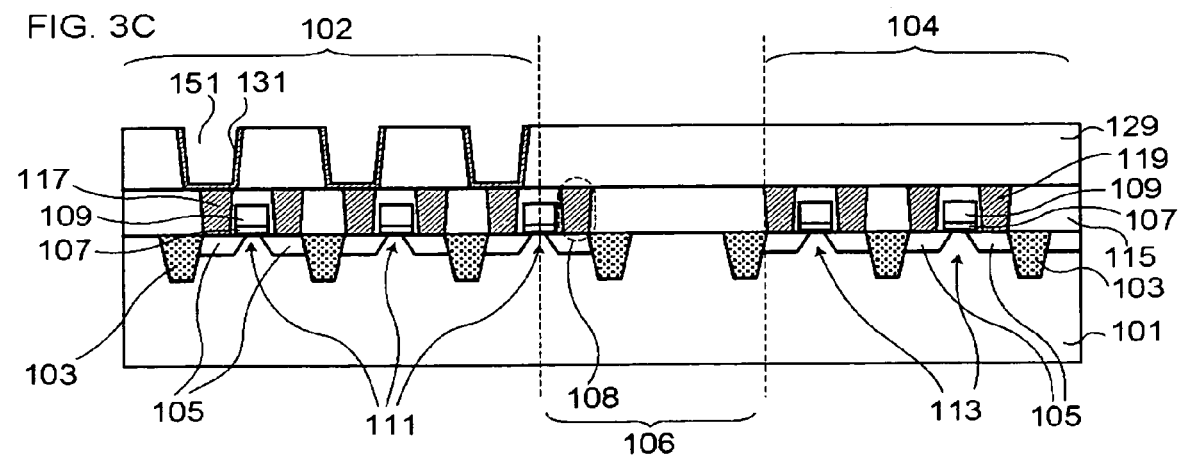

Proceeding to FIG. 3A, a second insulating layer 129 is deposited on the first insulating layer 115. A selective etching is performed to remove a region for capacitor elements 130 in the memory region 102, and to form a capacitor element connection hole 151, for connection to an upper face of the memory transistor connection plug 117 (FIG. 3B). A barrier metal layer (not shown), and a metal layer which is to serve as a lower electrode 131 are formed all over the second insulating layer 129, including an inner wall of the capacitor element connection hole 151. Then a resist pattern is placed on the second insulating layer 129, so as to cover an upper face of the capacitor element connection hole 151 and leave the remaining area as an opening, and the metal layer is removed except in a region to form the capacitor element 130, for example by dry etching. At this stage, the lower electrode 131 has been formed, which covers a side wall of the capacitor element connection hole 151 formed in the second insulating layer 129 and an upper face of the memory transistor connection plug 117, and fills a part of the capacitor element connection hole 151 (FIG. 3C).

Figure 4A:
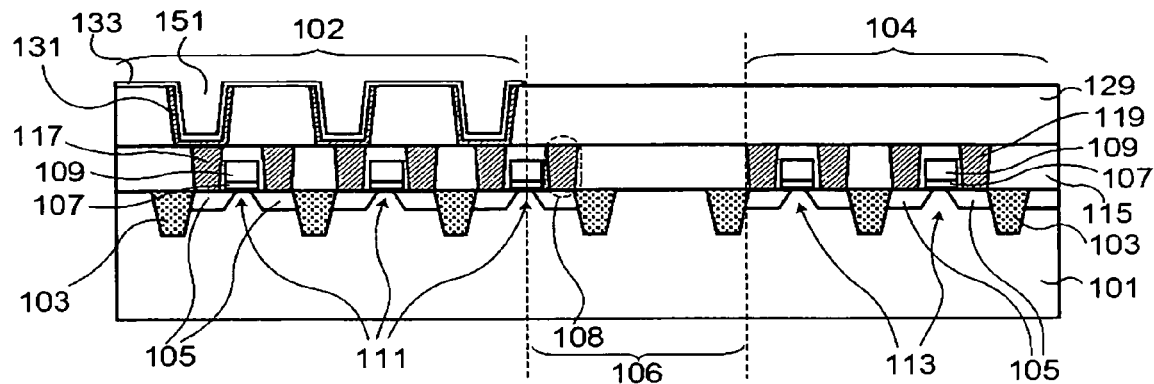
FIGS. 4A to 4C are schematic cross-sectional views sequentially showing a manufacturing process of the semiconductor device of FIG. 1.

Referring now to FIG. 4A, a capacitor layer 133 is deposited all over the second insulating layer 129. The capacitor layer 133 covers the exposed surface of the lower electrode 131 and fills a part of the capacitor element connection hole 151. The capacitor layer 133 may be constituted of SiN, for example. Alternatively, a high-k (high dielectric constant) film such as $HfO_2$ or $ZrO_2$ may be employed. The capacitor layer 133 may be deposited by a CVD process or an ALD (Atomic Layer Deposition) process. A thickness of the capacitor layer 133 may be appropriately set according to a capacity of the capacitor element 130, and a preferable range is 10 nm to 100 nm.

Figure 4B:
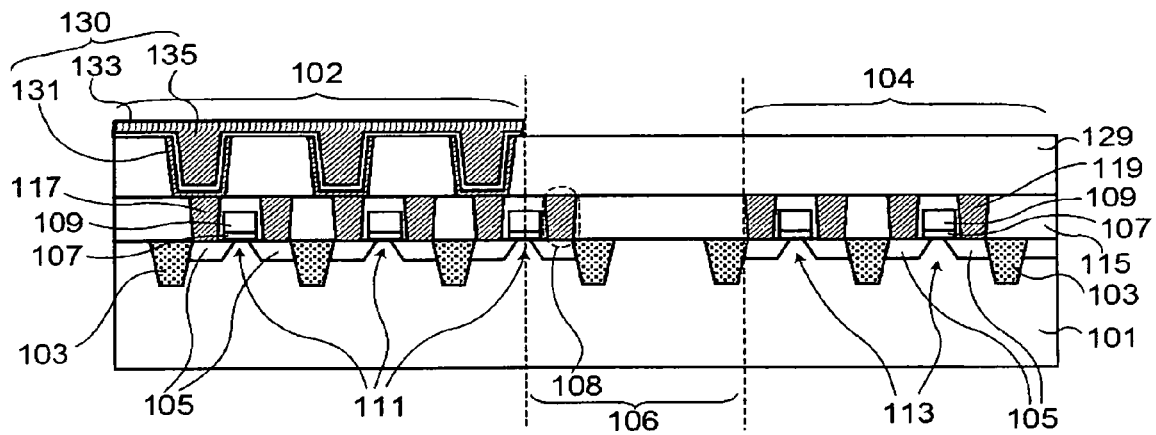

A barrier metal layer and a metal layer such as a Cu layer are sequentially formed in the capacitor element connection hole 151, by a similar method to forming the memory transistor connection plug 117, so as to fill the capacitor element connection hole 151 with the metal layer. Further, a portion of the metal layer extending into the boundary region 106 and the capacitor layer 133 that may be present under the metal layer extension are removed, for example by etching. At this stage, the upper electrode 135 has been formed (FIG. 4B). The upper electrode 135 is constituted in one continuous body, so as to fill the capacitor element connection holes 151 and to cover a plurality of capacitor elements 130. That is the formation process of the capacitor element 130.

Figure 4C:
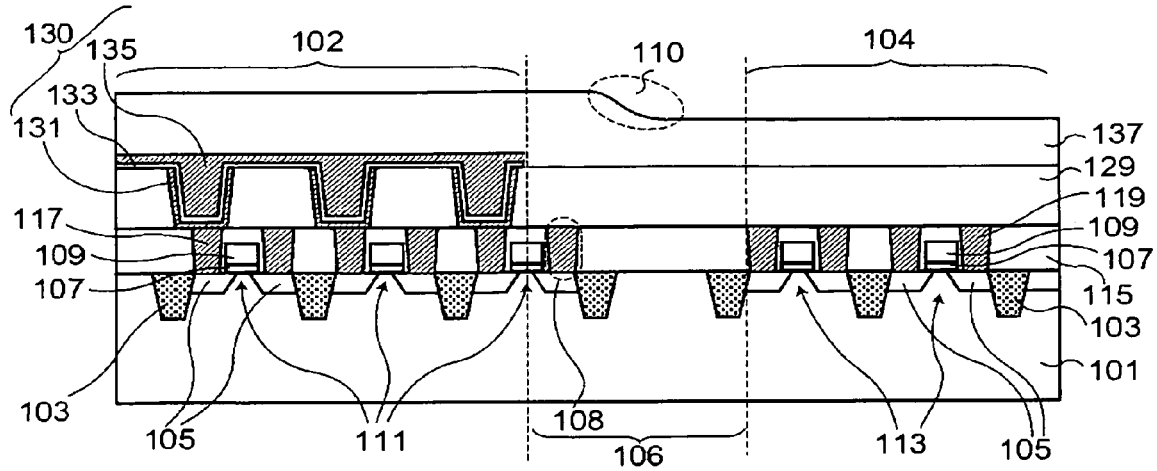

Referring to FIG. 4C, a third insulating layer 137 is formed on the second insulating layer 129 so as to cover the upper electrode 135, followed by a CMP process for planarization. At this stage, a global gap 110 is created because of a level difference between an upper surface of the capacitor element 130 and that of the second insulating layer 129. The global gap 110 appears either in the memory region 102 or in the boundary region 106, while in the logic region 104, an upper surface of the third insulating layer 137 is formed in a substantially plane surface.

A size of the global gap 110 is determined by a level difference between an upper surface of the upper electrode 135 of the capacitor element 130 and that of the second insulating layer 129. For example, when the upper electrode 135 located in a region except on the capacitor element 130 has a thickness of approx. 100 nm, and the capacitor layer 133 has a thickness of approx. 100 nm, the height of the global gap 110 is approx. 200 nm. It is to be noted that in FIG. 1 and other cross-sectional drawings, the height of the global gap 110 is exaggerated for easier visual understanding.

Figure 5:
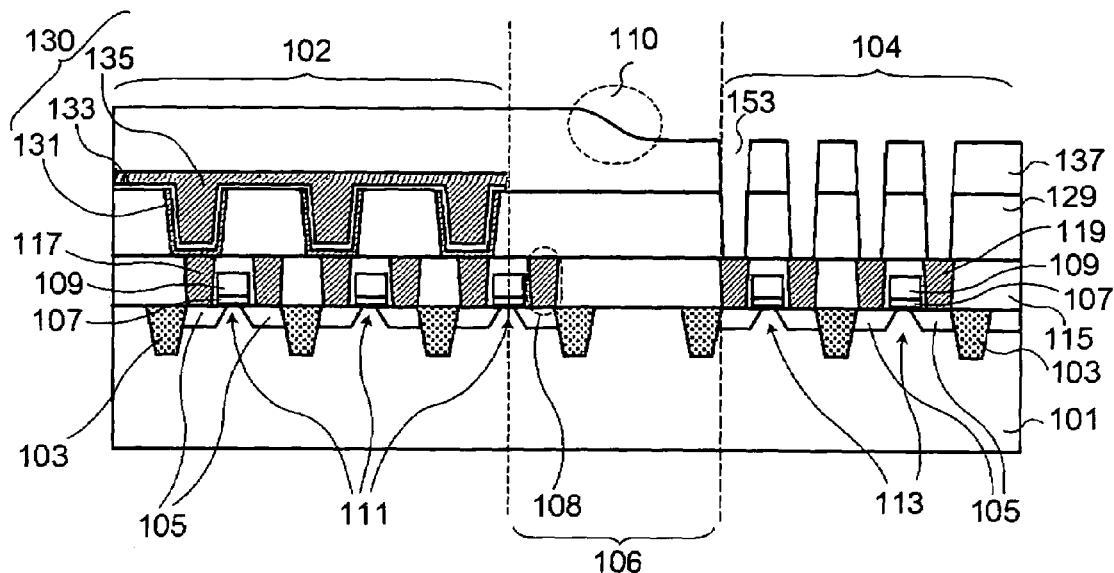
FIG. 5 is a schematic cross-sectional view showing a manufacturing process of the semiconductor device of FIG. 1.

Referring now to FIG. 5, a through hole 153 is formed at a position to form an interconnection plug 139 in the logic region 104, so as to penetrate the third insulating layer 137 and the second insulating layer 129 thus to reach an upper face of the logic transistor connection plug 119. Then the interconnection plug 139 is formed through similar steps to the formation of the logic transistor connection plug 119. The interconnection plug 139 may also be formed by a damascene process. That is how the semiconductor device 100 shown in FIG. 1 is obtained.

Here, a first interconnect layer (not shown) may further be formed on the third insulating layer 137, and a first interconnect (not shown) may be formed in the first interconnect layer for connection to the interconnection plug 139. The interconnection plug 139 and the first interconnect may be formed of copper, and by a damascene process, for example.

The semiconductor device 100 shown in FIG. 1 provides the following benefits.

The semiconductor device 100 includes the memory transistor connection plugs 117 located in the memory region 102, and the dummy contact plug 108 located in the boundary region 106. In the boundary region 106, the dummy contact plug 108, located at an outer periphery of the memory transistor connection plugs 117 in the memory region 102, is not connected to the capacitor element 130. Placing the dummy contact plug 108 at a further outer position of the outermost memory transistor connection plug 117 in the memory region 102 allows preventing a collapse of the formation pattern of the memory transistor connection plugs 117 in the memory region 102. Accordingly, the structure of the semiconductor device 100 allows flawless formation of the memory region 102.

Figure 12:
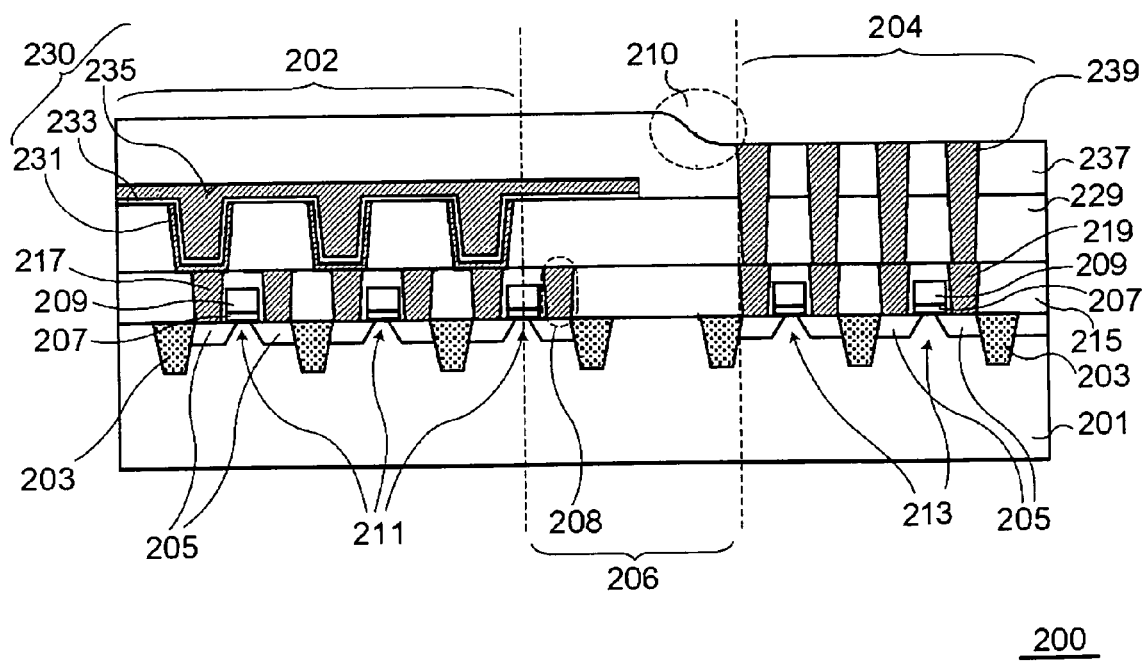
FIG. 12 is a schematic cross-sectional view showing a structure of an embedded type semiconductor device.

In the semiconductor device 100, an end portion of the lower electrode 131, the capacitor layer 133, and the upper electrode 135 is disposed closer to an inner region of the memory region 102, than the dummy contact plug 108. Above the dummy contact plug 108, the capacitor element 130 is not present. Also, a constituent of the capacitor element 130 is terminated inside the memory region 102, without intruding into the boundary region 106. Accordingly, unlike the semiconductor device 200 shown in FIG. 12, the global gap 110 corresponding to the thickness of the upper electrode 135 and the capacitor layer 133 appears in the memory region 102 or in the boundary region 106, but not in the logic region 104. Therefore, an upper surface of the third insulating layer 137 in the logic region 104 can be formed substantially in a plane surface. Such a structure effectively suppresses a pattern collapse in the formation of the interconnection plug 139 and an upper layer interconnect.

The semiconductor device 100 thus suppresses a pattern collapse of the memory transistor connection plug 117 in the memory region 102, as well as a pattern collapse of interconnection plug 139 and an upper interconnect in the logic region 104. Consequently, the semiconductor device 100 offers a higher yield through flawless manufacturing, despite being an embedded device.

In the embedded type semiconductor device, circuit patterns in the boundary region 106 in the second insulating layer 129 and the third insulating layer 137, in the region close to the capacitor element 130, are generally extremely fine, and hence prone to incur a pattern collapse if the insulating layer has an uneven surface. However in the semiconductor device 100, since an end portion of the lower electrode 131, the capacitor layer 133 and the upper electrode 135 constituting the capacitor element 130 is disposed closer to an inner region of the memory region 102 than the dummy contact plug 108, a circuit pattern collapse due to the global gap 110 is suppressed in the boundary region 106. Consequently, the micronized interconnects in the boundary region 106 can be precisely and stably fabricated.

Also, when the capacitor element 130 of a cylindrical shape is provided in the memory region 102 as shown in FIG. 1, generally the upper electrode 135 is shared by a plurality of such capacitor elements 130. In many of such cases, the upper electrode 135 is extended out of the formation region of the capacitor element 130, for connection to an upper layer interconnect. Such an extended portion often reaches a region close to the logic region 104 in the boundary region 106, thereby provoking a pattern collapse in a logic circuit.

However in the semiconductor device 100, even in the case of the embedded device including the capacitor element 130 having the sylinder shpe, since an end portion of the upper electrode 135 is located closer to the memory region 102 than the dummy contact plug 108, a pattern collapse in the logic circuit is effectively suppressed.

Further, the memory transistor connection plug 117 in the memory region 102, the dummy contact plug 108 in the boundary region 106, and the logic transistor connection plug 119 in the logic region 104 are all buried in the first insulating layer 115 and of a same height. Accordingly, these plugs can be formed together in a same step (FIG. 3A), which simplifies the manufacturing process. Such an advantage becomes more prominent when the memory transistor connection plug 117 and the logic transistor connection plug 119 are designed to have generally the same shape.

Figure 7:
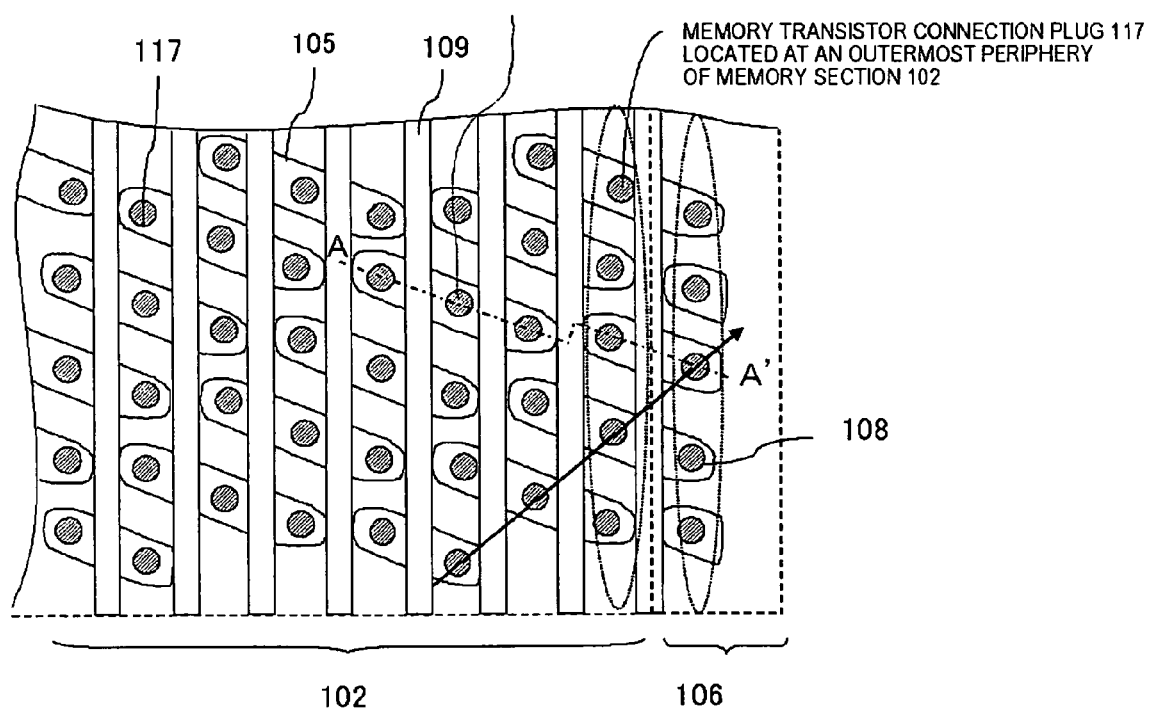
FIG. 7 is a schematic plan view showing a layout on a semiconductor device according to an embodiment.
Figure 8:
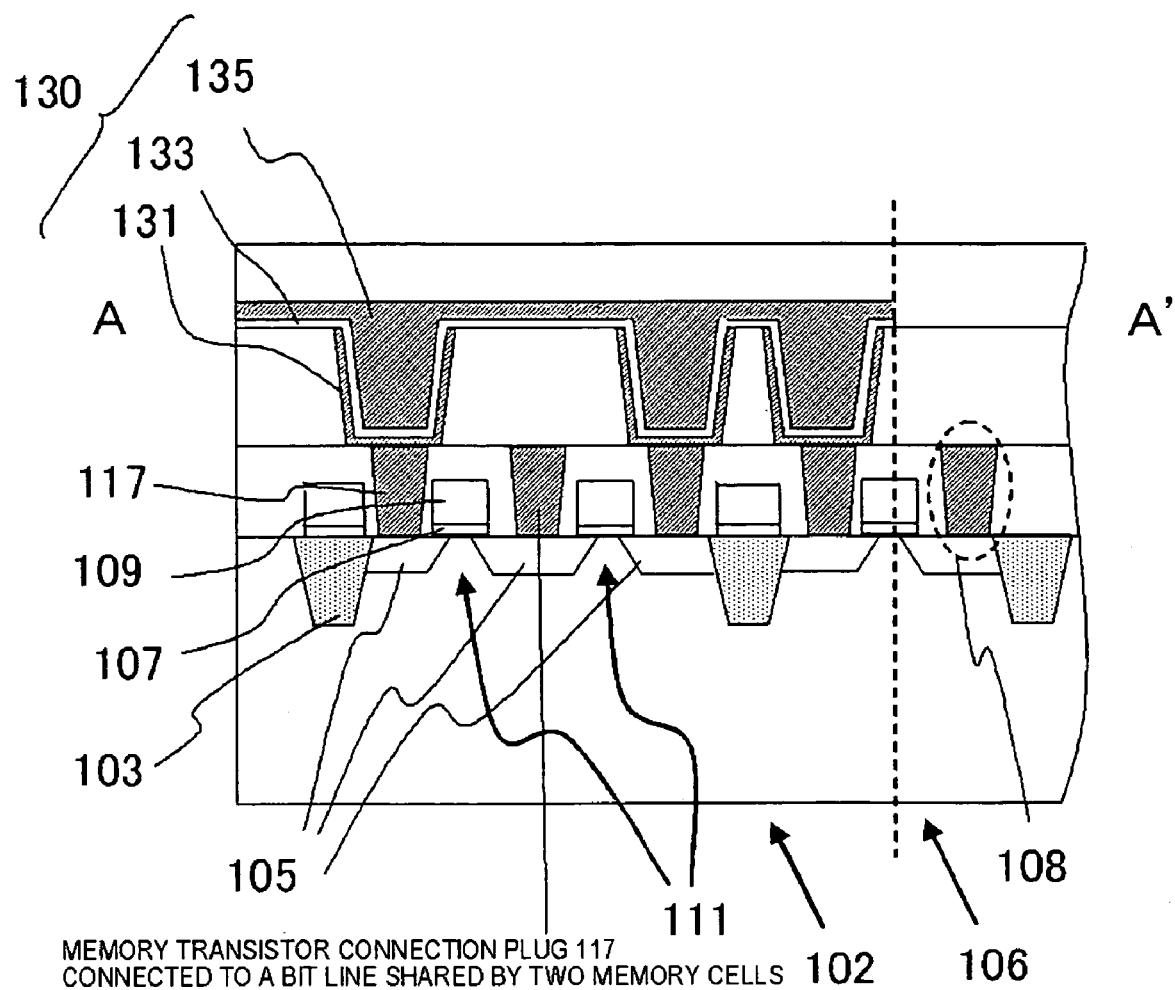
FIG. 8 is a schematic cross-sectional view taken along the line A–A' of FIG. 7.

In this embodiment, the layout of the memory region 102, the logic region 104 and the boundary region 106 may be arranged as follows. FIG. 7 is a schematic plan view showing in detail a layout in a region near a border between the memory region 102 and the boundary region 106, on a semiconductor device having the memory region 102 and the logic region 104. FIG. 8 is a schematic cross-sectional view taken along the line A–A' of FIG. 7.

As shown in FIG. 8, mutually adjacent two memory transistors 111 share a memory transistor connection plug 117 connected to a bit line (not shown) in the layout shown in FIG. 7, as well as in FIG. 9 to be later referred to. In other words, a plurality of diffusion layers 105 is arranged in parallel to one another on the chip forming surface of the silicon substrate 101.

A field of diffusion layer 105 includes three memory transistor connection plugs 117 rectilinearly aligned. Between the adjacent memory transistor connection plugs 117, two gate electrodes 109 (word line) are provided. The gate electrode 109 (word line) is extended over a plurality of diffusion layers 105 located next to each other. In the layout of FIG. 7, a plurality of rectilinearly extended gate electrodes 109 (word line) is arranged in parallel to one another.

The boundary region 106 includes the dummy contact plugs 108, which are regularly positioned at an outer position, on the side of the boundary region 106, of the memory transistor connection plugs 117 of the outermost row in the memory region 102.

Referring again to FIG. 8, an end portion of the capacitor layer 133 and the upper electrode 135 is aligned with the edge of the capacitor element 130, and hence the region above the dummy contact plug 108 is clear of the capacitor layer 133 and the upper electrode 135. In other words, the capacitor layer 133 and the upper electrode 135 are terminated at the border line between the memory region 102 and the boundary region 106 in FIG. 8. Therefore, the memory transistor connection plug 117 in the memory region 102 can be prevented from incurring a pattern collapse, and the presence of the global gap 110 does not exert an influence to the logic region 104. Consequently, the memory transistor connection plugs 117 in up to the outermost row in the memory region 102 can be effectively utilized, which allows securing a sufficient effective area in the memory region 102.

The semiconductor device shown in FIGS. 7 and 8 includes a plurality of memory transistor connection plugs 117 and the dummy contact plug 108 rectilinearly aligned at regular intervals from the memory region 102 toward the boundary region 106, as indicated by an arrow. Here, the terminal of the row on the side of the boundary region 106 is the dummy contact plug 108 located inside the boundary region 106. A plurality of such rows is arranged in parallel to one another. Accordingly, the memory transistor connection plug 117 at the outermost position of the row is effectively prevented from incurring a pattern collapse.

Figure 9:
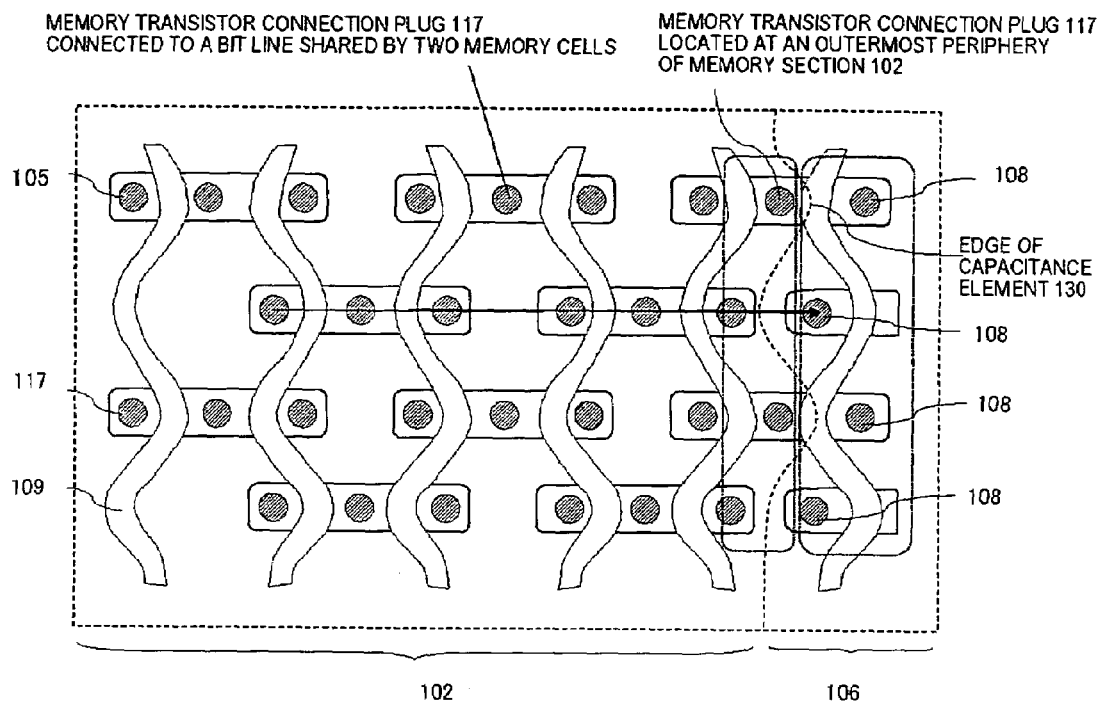
FIG. 9 is a schematic plan view showing a layout on a semiconductor device according to another embodiment.

The planar layout in a region near the border between the memory region 102 and the boundary region 106 may be arranged as shown in FIG. 9.

In FIG. 9, a plurality of memory transistor connection plugs 117 and dummy contact plug 108 are rectilinearly aligned at a predetermined interval, as indicated by an arrow. A plurality of such rows is provided in parallel to one another. The terminal of the row is the dummy contact plug 108 located inside the boundary region 106.

In FIG. 9 also, the dummy contact plug 108 is located at an outer position (on the side of the boundary region 106) of the outermost memory transistor connection plug 117, and included in the boundary region 106. Accordingly, a sufficient effective area can be secured in the memory region 102.

Also, while the semiconductor device 100 shown in FIG. 1 includes one dummy contact plug 108 in the boundary region 106 at an outer position of the memory transistor connection plug 117 in the memory region 102, a plurality of dummy contact plugs 108 may also be provided.

Figure 14:
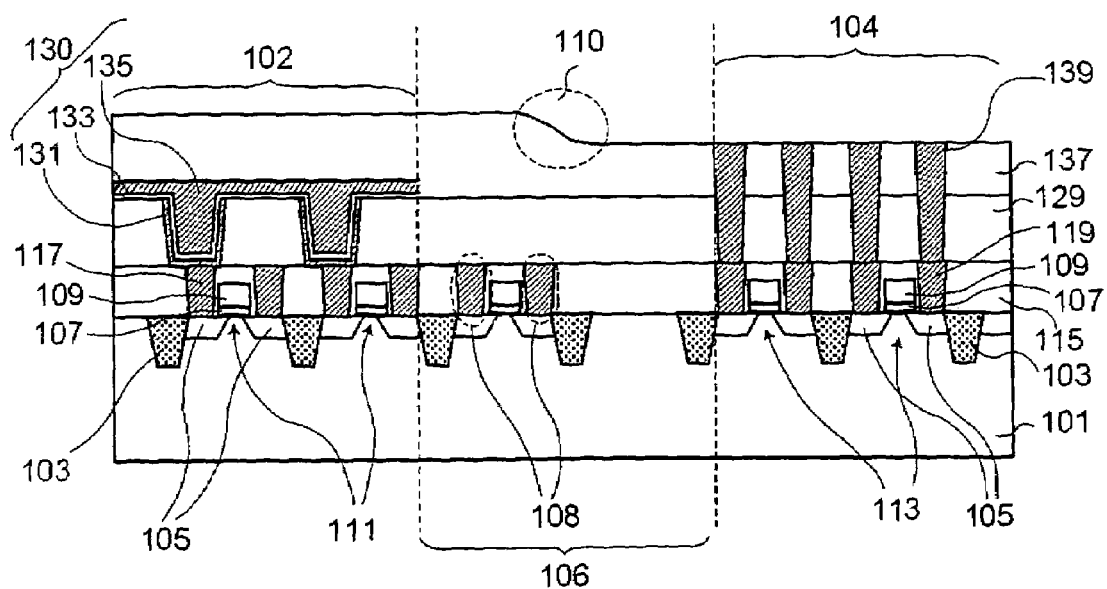
FIG. 14 is a schematic cross-sectional view showing a structure of a semiconductor device according to another embodiment.

FIG. 14 is a schematic cross-sectional view showing a structure of a semiconductor device according to the present embodiment. The semiconductor device shown in FIG. 14 has basically the same structure as that of the semiconductor device shown in FIG. 1, except that two dummy contact plugs 108 are provided in the boundary region 106, at an outer position of the memory transistor connection plug 117.

In the cross-section shown in FIG. 14, the capacitor element 130 or a constituent thereof is not provided on the two contact plugs connected to the diffusion layer 105 of the outermost memory transistor 111. Therefore, both of them serve as the dummy contact plug 108. Such configuration more assuredly suppresses a pattern collapse in the logic region 104 due to emergence of the global gap 110.

Regarding a semiconductor device according to the following embodiments, differences from the first embodiment will be primarily described.

Second Embodiment

Figure 10:
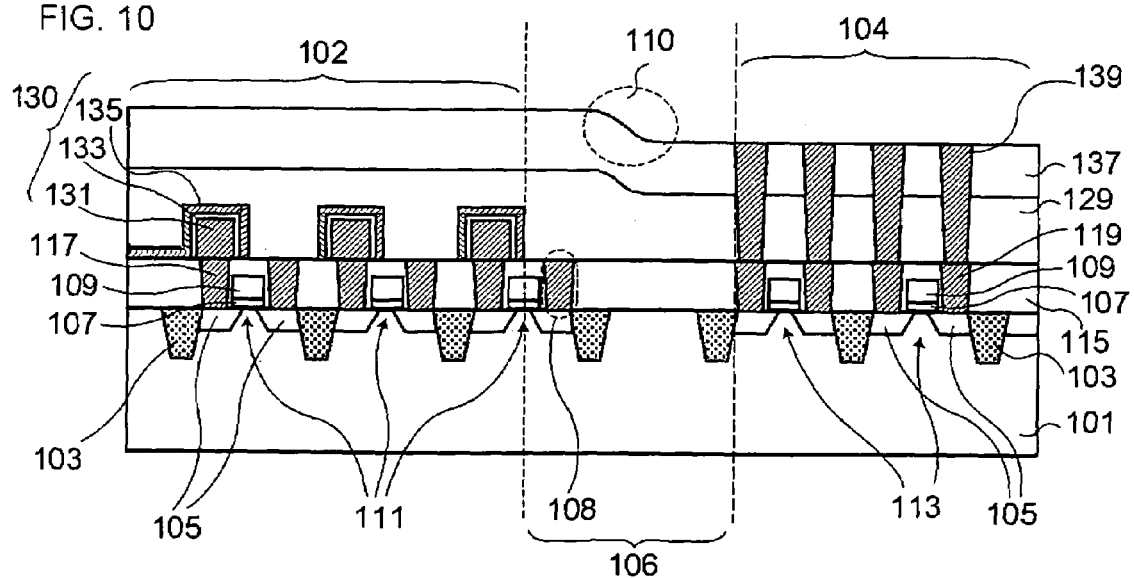
FIG. 10 is a schematic cross-sectional view showing a structure of a semiconductor device according to a second embodiment.

While the capacitor element 130 according to the first embodiment is of a cylindrical shape, the capacitor element 130 may formed in a different shape. FIG. 10 is a schematic cross-sectional view showing a structure of a semiconductor device according to a second embodiment. The structure of the semiconductor device 112 shown in FIG. 10 is basically the same as that of the semiconductor device 100 shown in FIG. 1, but stack-shaped capacitor elements 130 are provided in the memory region 102.

Figure 11:
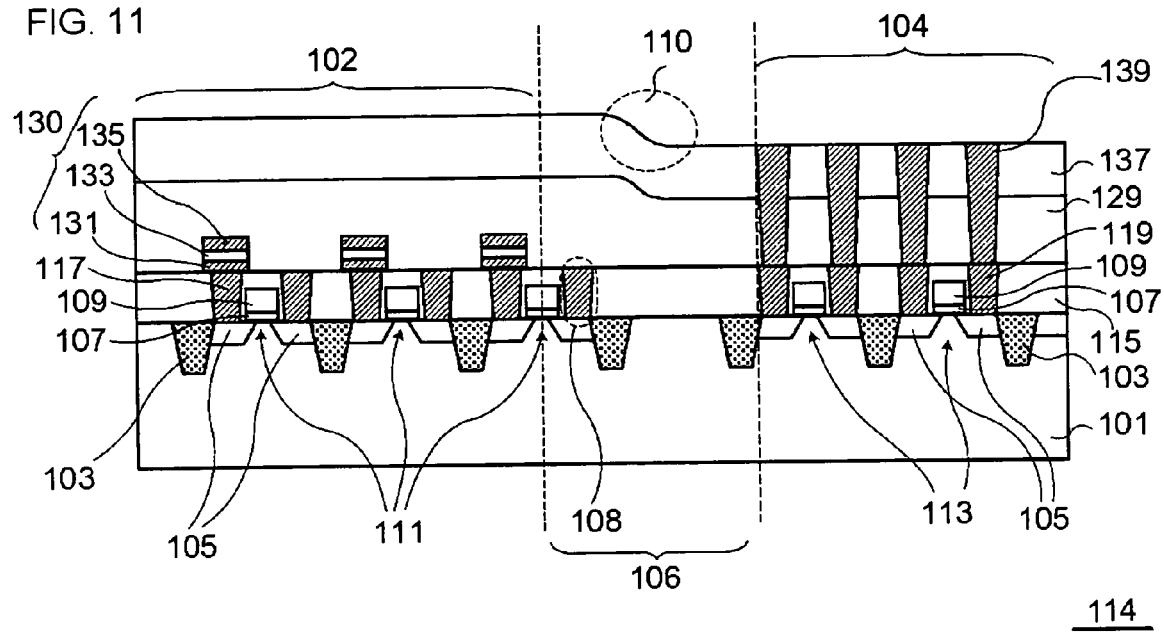
FIG. 11 is a schematic cross-sectional view showing a structure of a semiconductor device according to the second embodiment.

FIG. 11 is a schematic cross-sectional view showing another structure of a semiconductor device according to the second embodiment. The structure of the semiconductor device 114 shown in FIG. 11 is basically the same as that of the semiconductor device 100 shown in FIG. 1, but plate-shaped capacitor elements 130 are provided in the memory region 102. Because of this, a height gap is created also in the second insulating layer 129 in the boundary region 106.

In both of the semiconductor device 112 shown in FIG. 10 and the semiconductor device 114 shown in FIG. 11, the capacitor element 130 includes the lower electrode 131, the capacitor layer 133 and the upper electrode 135. The capacitor element 130 is located within the memory region 102, without intruding into a region above the dummy contact plug 108 in the boundary region 106. Accordingly, the global gap 110 does not affect the planarity of the upper surface of the logic region 104 in these structures, as in the semiconductor device 100 (FIG. 1) according to the first embodiment. Consequently, these structures also effectively suppress a pattern collapse of the memory transistor connection plug 117 in the memory region 102, as well as a pattern collapse of the interconnection plug 139 and an upper layer interconnect (not shown) in the logic region 104, and thereby provides a higher stability through the production.

In addition, the planar layouts shown in FIGS. 7 and 9 can also be applied to the semiconductor device 112 shown in FIG. 10 and the semiconductor device 114 shown in FIG. 11.

Although the embodiments of the present invention have been described in details referring to the drawings, it is to be understood that they are only exemplary, and that various modifications may be alternatively employed.

To cite a few examples, while the memory transistor connection plug 117 is directly connected to the lower electrode 131 of the capacitor element 130 according to the foregoing embodiments, one or more insulating layers may be provided between the first insulating layer 115 and the second insulating layer 129, so that the memory transistor connection plug 117 and the lower electrode 131 are connected via one or more conductive plugs. In this case, providing such conductive plugs in the boundary region 106 allows similarly suppressing a pattern collapse when forming the conductive plug.

Also, each of the first insulating layer 115 to the third insulating layer 137 and the capacitor layer 133 may be constituted of a stacked layer.

Further, in the foregoing embodiments, an oxide or a silicate containing one or more of Hf, Zr, Al, La, Y and Ta may be employed to constitute the capacitor layer 133.

Further, the barrier metal layer may contain a high melting point metal such as Ti, WN, Ta or TaN, instead of TiN. Alternatively, a tantalum-based barrier metal containing stacked TaN or Ta may be employed. The barrier metal layer may be formed by a sputtering or CVD process, or the like.

Still further, various other materials may be employed to constitute the etch-stopper layer, for example a material containing nitrogen such as SiCN or SiON.

It is apparent that the present invention is not limited to the above embodiment, that may be modified and changed without departing from the scope and spirit of the invention.

What is claimed is:

1. A semiconductor device comprising:
   a semiconductor substrate;
   a memory region provided on said semiconductor substrate, said memory region including a first transistor provided on a main surface of said semiconductor substrate, a first insulating layer covering said first transistor, a capacitor element formed on said first insulating layer, and a plurality of capacitor contact plugs connecting a diffusion layer of said first transistor and said capacitor element;
   a logic region provided on said semiconductor substrate, said logic region includes a second transistor provided on said semiconductor substrate and covered with said first insulating layer, an interconnect layer formed on said first insulating layer; and
   a boundary region located between said memory region and said logic region, provided on said semiconductor substrate, said boundary region including a dummy contact plug having its upper surface covered with an insulating layer and located in the same layer as said capacitor contact plug;
   wherein a conductive layer and a capacitor layer constituting said capacitor element are terminated at a position closer to an inner region of said memory region than said dummy contact plug is.

2. The semiconductor device according to claim 1, further comprising:
   a second insulating layer formed on said first insulating layer;
   wherein said capacitor element includes a first conductive member that covers an inner wall of a through hole located on said capacitor contact plug and penetrating said second insulating layer, and is connected to an upper face of said capacitor contact plug, a second conductive member located with a separation above said first conductive member so as to fill said through hole, and said capacitor layer located between said first conductive member and said second conductive member; and
   wherein an end portion of said second conductive member shared by a plurality of said capacitor elements is located closer to an inner region of said memory region than a region where said dummy contact plug is provided.

3. The semiconductor device according to claim 1, further comprising a row including a plurality of said capacitor contact plugs and said dummy contact plug, said capacitor contact plugs and said dummy contact plug being linearly aligned with a spacing in said row, from said memory region toward said boundary region,
   wherein an end portion of said row on the side of said boundary region is terminated at said dummy contact plug provided in said boundary region.

4. The semiconductor device according to claim 3, wherein said capacitor contact plugs and said dummy contact plug are disposed at constant intervals in said row.

5. The semiconductor device according to claim 1, wherein said capacitor element is a DRAM cell.

6. The semiconductor device according to claim 1, wherein said logic region includes a peripheral circuit of said memory region.

* * * * *